United States Patent [19]

Strickland

[11] Patent Number: 4,496,910
[45] Date of Patent: Jan. 29, 1985

[54] PRE-AMPLIFIER HAVING IMPROVED SONIC PERFORMANCE

[76] Inventor: James C. Strickland, 1595 NE. 175th St., N. Miami Beach, Fla. 33162

[21] Appl. No.: 384,504

[22] Filed: Jun. 3, 1982

[51] Int. Cl.³ .......................... H03G 3/10; H03F 1/34
[52] U.S. Cl. .................................. 330/279; 330/283; 330/294
[58] Field of Search ................ 330/86, 252, 253, 279, 330/283, 310, 311, 304, 294

[56] References Cited

U.S. PATENT DOCUMENTS 4,174,503 11/1979 Merklinger et al. ................ 330/311

Primary Examiner—James B. Mullins
Assistant Examiner—G. Wan
Attorney, Agent, or Firm—Ziems, Walter & Shannon

[57] ABSTRACT

An amplifier topology suitable for amplification of the frequency dependent output of a transducer to provide a frequency equalized amplifier output includes a first transconductive stage for converting a voltage input signal to the current domain through a signal node and a second transreactive stage for converting the signal current into an output voltage. An active equalization network feeds back a representation of the output signal to the signal node in such a way that the fed back signal voltage error is not affected by the high impedance thereat to provide error correction feedback that is achromatic with frequency and, accordingly, does not vary across the range of frequencies amplified, to provide the second amplifier with a frequency independent closure ratio, while not reducing second amplifier voltage gain.

9 Claims, 2 Drawing Figures

PRE-AMPLIFIER HAVING IMPROVED SONIC PERFORMANCE

CROSS-REFERENCE TO RELATED APPLICATION

The present invention is related to the subject matter disclosed in U.S. patent application Ser. No. 337,290, filed by the present inventor on Jan. 5, 1982 and entitled "Distortion-Free Complemented Error Feedback Amplifier," the disclosure of which is incorporated herein by reference.

BACKGROUND OF THE INVENTION

The present invention relates to amplifiers for amplifying electric signals and, more particularly, to amplifiers for amplifying the frequency dependent output of transducers such as phonograph and magnetic tape playback transducers.

Known transducers for providing audio frequency range electrical signals from a recording media, such as a phonographic record or a magnetic media, characteristically provide a voltage output that varies with frequency. Typical phonograph transducers of the magnetic type, such as the moving magnet/iron or the moving coil type, have a frequency dependent transfer function that exhibits a 40 dB increase in output voltage with increasing frequency across the audio frequency spectrum and oftentimes exhibit resonant 'peaking' at one or more regions within the audio frequency spectrum. Similar frequency dependent transfer characteristics are also associated with playback heads used to obtain electrical signals from a moving magnetic media, such as magnetic tape, in which the playback head output variation approaches 50 dB.

Because of the known variation in transducer output with frequency, industry standards have been established by the RIAA and the NAB for phonograph and magnetic media preamplifiers so that the preamplifier output compensates for the frequency dependent output of the transducer and the characteristics of the recording media to provide a reasonably flat output over the audio frequency spectrum.

Past techniques for implementing the RIAA, the NAB, or other standard characteristic curves have involved the use of a frequency dependent RC network functioning as a passive filter in the forward signal path or as part of a frequency dependent negative feedback path.

In the passive approach, an RC or equivalent device network is inserted into the forward signal path, typically between two amplifier stages. The first stage amplifies the transducer output and provides this initially amplified signal to the RC network which is configured to have a frequency dependent response that is the inverse of the transducer's so that the output of the RC network is substantially flat over the audio frequency spectrum. The second stage then amplifies the now-flat signal to compensate for the insertion loss of the RC network and provide a signal that is compatible with the next succeeding stage of amplification or other signal utilizing device.

While the passive equalization approach is generally satisfactory, there are a number of attendant disadvantages. The first stage of amplification must have a fairly wide dynamic range since it must provide adequate gain at the lower frequency portion of the audio frequency spectrum where the transducer output is relatively low and still effect adequate amplification at the high end of the audio frequency range where the transducer output is 40–50 dB higher for the same program material level. If the dynamic range of the first amplification stage is insufficient, undesirable amplifier saturation can occur at the high end of the audio frequency spectrum. Since typical RC equalization networks have a substantial insertion loss, the post-network amplifier stage must have high enough gain to compensate for the insertion loss although high-gain signal amplification increases the probability of a noise component being impressed on the amplified signal.

In the active equalization approach, a frequency dependent RC network is inserted into the degenerative or negative feedback path of the amplifier so that the amount of feedback and the consequent forward gain, A, of the amplifier is frequency dependent so as to have an essentially flat output over the audio frequency spectrum.

The active equalization approach, while effective for its intended purpose, also has a number of attendant drawbacks. Since the forward gain, A, of the amplifier must be varied over a wide dynamic range by varying the magnitude of the negative feedback, sonic 'coloring' can be introduced into the signal at the lower and higher frequency ends of the audio frequency spectrum. At the lower end of the spectrum, where high gain is required, the amplifier can exhibit insufficient closure ratio, inadequate distortion reduction, and high output impedance. At the higher frequency end of the audio frequency spectrum, where 40–50 dB less gain is required, the increased amount of negative feedback necessary to achieve the desired gain reduction can lead to instabilities, phasing problems, and transient induced distortions in the amplified signal.

While each of the above described equalization approaches can provide amplifiers having comparable steady state quantitative performance, each approach has attendant drawbacks that can undesirably color the qualitative or sonic performance of the amplifier, especially at the lower and upper ends of the audio frequency spectrum.

SUMMARY OF THE INVENTION

In view of the above, it is a primary object of the present invention to provide an amplifier having improved sonic performance.

It is another object of the present invention to provide a preamplifier having improved sonic performance which is relatively simple in comparison to prior preamplifiers.

It is another object of the present invention to provide a preamplifier having an equalization network in a negative feedback loop that is configured to provide a negative error-voltage feedback that is achromatic in terms of frequency, that is, a feedback voltage component that represents output stage error or distortion and which does not vary substantially over the entire audio frequency spectrum.

It is a further object of the present invention to provide an amplifier in which the signal to be amplified is transported internally in the current domain whereas the negative voltage-error feedback component is fed back independently in the voltage domain.

It is still a further object of the present invention to provide an amplifier having a transconductance input stage with as high as practicable output impedance so that fedback voltage errors from a subsequent stage see the high output impedance and are accordingly unaffected by frequency to provide a frequency-independent high loop-closure-ratio, little or no reactive phase-shift around the subsequent stage, and to provide an amplifier stage having substantially equal open-loop and closed-loop voltage gain.

It is an even further object of the present invention to provide a transconductive stage, able to be altered in gain, while having little or no effect on the cooperative equalization curve developed in conjunction with a subsequent stage.

In accordance with these objects and others, the present invention provides for a preamplifier that includes a first transconductive stage having or configured to have a very high output impedance. The transconductance stage receives the voltage signal output of a transducer and converts that voltage into an output current through a signal node. A subsequent transreactive stage returns the current output of the first stage to the voltage domain. An RC equalization network is provided in a feedback loop about the transreactive stage and accomplishes equalization by altering the current-to-voltage conversion ratio of the second stage as a function of frequency.

The instananeous voltage or rate-of-change of voltage of the second stage output may be considered as comprising two superposed components—the valid output signal and an error signal, which error signal represents the error introduced by the active devices in the amplifying stage and the error caused by non-linearities in the load. The amplifier circuit is effective to separate these two components, that is, the valid output signal and the error signal, and treat each differently so as to provide improved sonic performance. A valid output signal voltage component results from the ideal part of the current-to-voltage-function operation of the second stage. These ideal or valid output voltage functions produce, through the equalization network, an ideal opposition or summing current against the forward-propagating signal current in just the proper manner to result in the minute voltage node excitation required to drive the signal node—i.e., the second amplifier. The nodal voltage (drive) is not a function of frequency, as the second amplifier is a flat-frequency stage throughout the audio frequency range. Two independent, yet superposed, feedback models are operative in the inventive circuit improvement. Firstly, classic negative feedback is processed in the current domain as the input signal voltage appears as a current analog at the signal node, in summation against an exactly equal and opposite frequency-dependent valid-output analog of output voltage, provided through the equalization network. This operation produces the small nodal drive voltage component representing the valid current-to-voltage-function conversion in the second stage. Secondly, fully superposed on the above behavior is the "anisotropic" feedback which occurs entirely in the voltage domain. It is entirely voltage domain because of the intentionally optimized very high output impedance of the first stage. Voltage errors at the second stage output cannot produce significant error current in the equalization network because of the very high dynamic impedance which the network "divides" into. Thus error behavior of the second stage obeys all feedback models for full or 100% negative voltage feedback, except that there is no reduction of stage voltage gain.

This result is uniquely present because the first stage instantaneous current output is virtually independent of all signal-node voltage changes, and is particularly independent of the full negative voltage error feedback signal which is also superposed at the node. This combination allows a second stage amplifier having typically 75 dB of forward voltage gain while yet showing the reductions in distortion, noise, and output impedance classically predicted by a 75 dB negative loop closure, i.e., over 5000:1.

It is important for sonic quality reasons that the voltage-error negative feedback around the second stage operate entirely in real-time—i.e., without phase shift. Conventional active feedback equalization does not do this because the typical reactive network in the feedback path dividing into a finite low resistance causes the feedback to be largely the time-derivative or rate-of-change of the error at the output. This time-derivative feedback is not fully effective for error reduction and can oftentimes create its own recirculation errors.

In the preferred form of the invention, a current source transconductive device, such as a JFET, is provided with resistance source degeneration to provide a voltage-to-current transfer characteristic with high output impedance driving a signal node. A succeeding FET "operational" amplifier stage is in circuit with the signal node to return the signal to a voltage output. An RC equalization network in a feedback loop around the operational amplifier stage returns a signal comprising ideal oppositional currents and full error voltage to the signal node. The signal to be amplified is effectively transported forwardly through the amplifier node in the current domain while the feedback voltage error information is returned to the signal node in the voltage domain so that the voltage error fed back is virtually unaffected by the high impedance seen by the feedback over the audio frequency spectrum and is, accordingly, frequency achromatic. Since the first stage is transconductive and drives a voltage node, it has a very wide dynamic range when compared to comparable voltage-to-voltage converting stages.

BRIEF DESCRIPTION OF THE DRAWINGS

The above description, as well as the objects features, and advantages of the present invention will be more fully appreciated by reference to the following detailed description of a presently preferred, but nonetheless illustrative, embodiment in accordance with the present invention taken in conjunction with the accompanying drawing wherein.

DESCRIPTION OF THE PREFERRED EMBODIMENT

Figure 1:
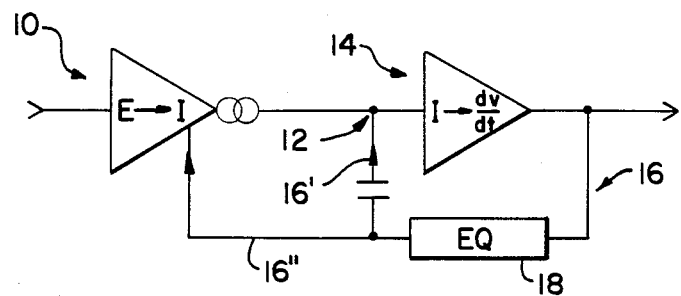
FIG. 1 is a schematic block diagram summary of an amplifier in accordance with the present invention illustrating the principle of operation.

A schematic block diagram of a preamplifier topology in accordance with the present invention is illustrated in FIG. 1 and includes a first transconductive stage 10, that is, a stage that accepts a voltage signal input from a transducer (not shown) and provides a bilateral signal current output that is very proportional to the transducer voltage input. The transconductive stage 10 is selected or configured to have a very high output impedance as discussed more fully below. The current flow output of the transconductive stage 10 is provided through a signal path that includes a signal node 12 to a second transreactive stage 14, such as in an operational amplifier which converts current through the node 12 to a voltage-function output, viz., I→dv/dt+v. A degenerative or negative feedback loop 16 including AC feedback path 16' is provided about the transreactive stage 14 to transfer a signal representative of the voltage output to the signal node 12. A further AC and DC feedback path is provided to the transconductive stage 10 through path 16". In practice, the negative feedback loop 16 includes an RC equalization network 18 that is effective to vary the amount of fed back valid signal current as a function of frequency to provide a substantially flat output across the audio frequency band for the varying transducer signal level.

In operation, the typically low voltage output of a transducer is accepted by the first stage 10 and converted to a signal-responsive current flow through the signal node 12. The following transreactive stage 14 effects the current-to-voltage-function transfer by returning "summing" currents through the RC equalization network 18 to the signal node 12. Since the signal node 12 has a high impedance for feedback, the voltage error fed back to the node has a large impedance to "divide" into and, as a result, is introduced into the signal path in virtually undiminished form. The high impedance seen by the feedback, compared to equalization network impedance, also causes the fed back voltage error to be substantially independent of frequency, that is, frequency achromatic. This allows the amplifier to have a frequency achromatic closure ratio without having to "roll-off" high frequency open-loop gain, as practiced in the prior art.

Figure 2:
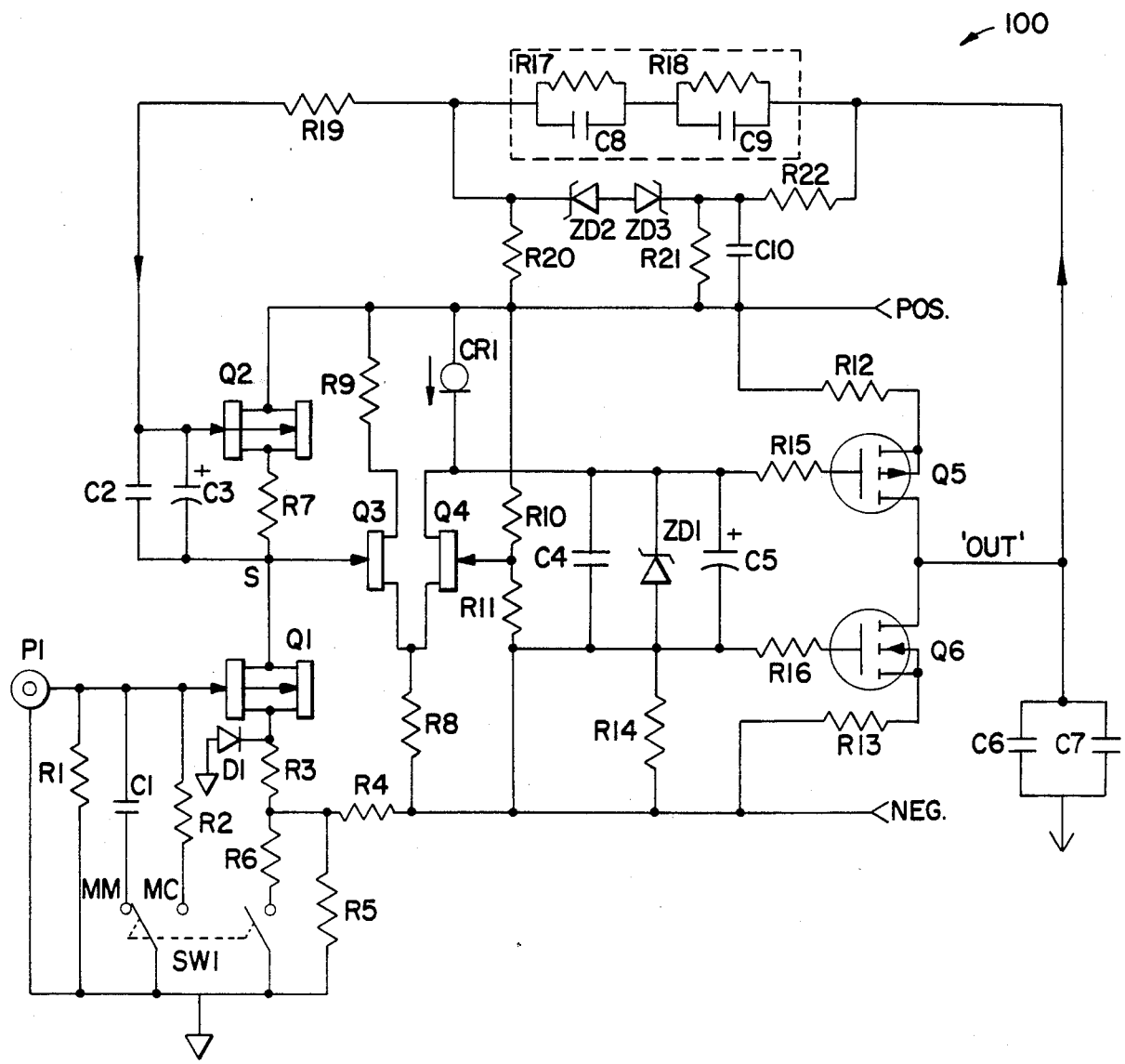
FIG. 2 is a schematic diagram of a preferred embodiment of a preamplifier in accordance with the present invention.

FIG. 2 illustrates a preferred circuit embodiment of the inventive configuration and is generally referred to therein by the reference character 100.

The amplifier 100 includes a first or input stage of transconductive type defined by serially connected transistors Q1 and Q2 with Q1 serving as signal input and Q2 serving as an autonulling active current source that serves to balance out the average DC current through Q1, as described more fully below. The transistors Q1 and Q2 are serially connected between the positive and negative power supplies through the below described resistors which provide a measure of resistive degeneration to increase the output impedance and stabilize the transconductance of the transconductive stage defined by Q1 and Q2. A second or following transreactive output stage is defined by Q3, Q4, Q5, and Q6 configured as an "operational" amplifier with transistors Q3 and Q4 configured as a differential input amplifier and the transistors Q5 and Q6 configured as a complementary push-pull output stage.

The input signal transistor Q1 is a JFET selected for a relatively high output impedance or resistance such as the 2SK146 (N-Channel) dual JFET manufactured by the Electronic Components Division of Toshiba America, Inc., Tustin, Calif. 92680. As shown in FIG. 2, Q1 is defined by two halves of the described dual transistor in a parallel twinned configuration to effect a noise reduction of 3 dB. The input signal, which is typically provided from a magnetic phonograph pick-up (e.g., of the moving magnet/iron or moving coil type) is provided to the gate of Q1 via a direct connection from an input connector P1 with resistor R1 and either resistor R2 or capacitor C1. A switch SW1 permits alternate selection of capacitor C1 for a moving magnet/iron type pick-up or selection of resistor R2 for a moving coil type pickup, as indicated, so as to change the pickup loading, if desired. The source of transistor Q1 is connected through resistors R3 and R4 to the negative power supply and through resistor R5 to ground, which cause resistive source degeneration to increase the output impedance of transistor Q1. The resistor R6 is selectively connected in parallel to ground with the resistor R5 via switch SW1 to change the forward transconductance of the input stage to accomodate the lower signal voltage input provided from moving coil type magnetic pick-ups. A diode D1 is provided from the source of transistor Q1 to ground to prevent the application of the negative power supply current to the gate of transistor Q1 and to the directly connected pick-up in the event of the loss of the transistor Q2 balance current.

For the selected transistor Q1, the source resistors R3 and R4 provide about 10 ma. of current with resistor R3 providing a voltage drop of about 150 mv. approximately equal to the pinch-off voltage required for 10 ma. to place the transistor Q1 on the desired part of its characteristic curve.

Active current source leading for the transistor Q1 is required so that the equalization network will see a very high impedance and is provided by transistor Q2, resistor R7, and capacitors C2 and C3. Resistor R7 is connected from the drain of transistor Q1 through a signal node S to the source of Q2 with the drain of Q2 connected directly to the positive power supply source and the capacitors C2 and C3 connected between the signal node S and the gate of transistor Q2. A combined DC and AC feedback signal is provided directly to the gate of the transistor Q2, to cause the transistor Q2 to effect average DC current balance with the transistor Q1, while yet acting as a near ideal current source for Q1. This feedback also actively equalizes the input signal as it is transported forwardly through the amplifier. In the preferred embodiment, transistor Q2 is preferably defined by the aforementioned Toshiba 2SK146 N-Channel dual JFET in a parallel twin configuration.

The second, operational amplifier stage includes a differential input defined by N-Channel JFET's Q3 and Q4 having their sources coupled through a source current determining resistor R8 to the negative power supply. The drain of transistor Q3 is connected through a current determining resistor R9 to the positive power supply, and the drain of transistor Q4 is connected through a constant current device, such as current regulator diode CR1, to the positive power supply. The gate of transistor Q3 is connected directly to the signal node S with bias control for the gate of transistor Q4 effected by a resistive voltage divider defined by resistors R10 and R11 and biased to a potential similar to that at the gate of transistor Q3. A positive going signal at the gate of transistor Q3 will cause a positive going output signal at the drain of Q4 and vice versa.

The output stage is defined by enhancement mode MOSFET transistors Q5 and Q6 of complementary type such as the Supertex VP01 (P-type) and the VN13 (N-type), respectively. The sources of transistors Q5 and Q6 are connected, respectively, to the positive and negative power supplies through current determining resistors R12 and R13 with their respective drains connected in common to the output 'OUT.' Inter-gate biasing is provided through a resistor R14 and level shifting Zener diode ZD1 and signal coupling through capacitors C4 and C5. The signal path to the gate of transistor Q5 is through resistor R15 and to the gate of transistor Q6 through capacitors C4 and C5 and resistor R16.

The output of the amplifier 'OUT', from the commonly connected drains of the transistors Q5 and Q6, is presented through coupling capacitors C6 and C7 to a signal output utilizing device, such as succeeding stage of amplification, and to a negative feedback loop that includes a signal equalizing network, such as the RIAA equalizing network formed from resistors R17 and R18 and capacitors C8 and C9. The equalizing network has a relatively high DC and low-frequency AC impedance which effects high total amplifier gain at the low-frequency end of the audio frequency spectrum and a diminishing AC impedance with rising frequency to effect a gain decrease with frequency that compensates for the increasing output of the transducer.

The frequency dependent valid-current and frequency-independent voltage feedback signal is provided through resistor R19 to the gate of active current source transistor Q2, the feedback signal being both a low-level DC current that is effective to charge C2 and C3 to provide gate control for Q2 to effect average DC current control through Q2 to balance Q1 and an AC signal presented through capacitors C2 and C3 to the signal node and also to the gate of transistor Q3.

In operation, the switch SW1 is positioned for the selected type of transducer used and the low-level audio frequency AC voltage output of the transducer is applied directly to the gate of Q1 to cause transistor Q1 to effect very proportional variation in the current flow through Q1 with a positive going voltage at the gate of Q1 causing an increasing negative output current flow and a negative going voltage causing a positive output current flow.

The current flow variations through the signal node S result in a nodal voltage drive to the gate of transistor Q3 of the Q3/Q4 differential amplifier with the output thereof at the drain of transistor Q4 provided to the gates of transistors Q5 and Q6 through the aforedescribed circuit devices. The output signal representation through the equalization network is returned as an RIAA (or NAB) inverse DC and AC signal with the DC voltage component controlling Q2 to exhibit an auto current nulling effect to balance out the average DC current through input transistor Q1, and the AC current and error voltage component provided to the signal node S to effect frequency-dependent current-to-voltage conversion in the second stage and frequency independent error correction.

Since the micro-farad value of the capacitor combination C2 and C3 can be relatively substantial and since the RIAA (or NAB) equalization network can have a high DC resistance, a substantial time delay can be experienced after initial turn-on before the first stage reaches equilibrium. To this end, an equalization network by-pass circuit can be used to by-pass the RIAA network to effect a more rapid time-to-equilibrium for the first stage. A suitable by-pass circuit includes resistors R20, R21, and R22; capacitor C10; and back-to-back Zener diodes ZD2 and ZD3. The Zener value of the Zener diodes ZD2 and ZD3 and the other circuit components is selected so that when the potential difference across the equalization network is appreciably different from a selected amount, for example, eleven volts, the Zener diodes ZD2 and ZD3 will conduct to provide the output signal directly to the the capacitors C2 and C3 to effect a more rapid charging than would otherwise to possible through the components of the equalization network.

As can be appreciated from the above, the signal at the gate of transistor Q1 is transferred to the current domain through the transistors Q1 and Q2 and passes through the signal node. On the other hand, the AC feedback error that is returned in the voltage domain through the equalization network sees basically only the high impedance of the first stage output characteristic to "divide" into and is thus undiminished upon its return. Since the impedance seen by the feedback voltage at the signal node S is made as high as practicable, the AC voltage error signal has an achromatic aspect, that is, it remains unaffected by the node impedance over the audio frequency range. As a consequence, the absolute loop closure and loop-closure-ratio of the second amplifier is frequency achromatic and the second amplifier exhibits substantially the same very high open and closed loop voltage gain.

As may be appreciated by those skilled in the art, the present invention provides for the forward transport of the signal in the current domain through a signal node, having very high shunt impedance to the return of the feedback voltage changes propagated through the much lower impedance equalization network. Thus the fed back voltage error, and forward current, signal effectively become gain independent to minimize qualititative 'coloring' of the sonic qualities of the amplifier. Further, the current driver defined by transistor Q1 and the following voltage stage achieve the anisotropic characteristics disclosed in the cross-referenced patent application, that is, a second amplifier with full forward voltage gain and the appearance of unity gain when viewed from the load and with an output stage having desirably low impedance, approximately 1 ohm. The current balancing of transistor Q1 via the active auto-null current load provided by the transistor Q2 permits precise and effective control of the transistor Q1 drain potential without the need for transistor Q1 gate bias control and thus provides an amplifier having a desirably uncommitted gate input without sonically intrusive and noisy gate connected biasing or other gate or source connected devices.

As will be apparent to those skilled in the art, various changes and modifications may be made to the amplifier of the present invention without departing from the spirt and scope of the invention as recited in the appended claims and their legal equivalent.

What is claimed is:

1. A preamplifier circuit for amplifying an information carrying voltage input signal in a frequency range that includes the audio frequency spectrum, the input voltage varying in magnitude as a function of its frequency, said preamplifier circuit providing an output the magnitude of which is substantially independent of frequency, said preamplifier circuit comprising:

a first amplifier stage of a transconductive current source type provided with an input port for receiving a voltage varying input signal to be amplified and having an output port of high impedance through which a current flows as a function of the voltage varying input;

a second amplifier stage of the current-to-voltage transreactive type provided with an input port connected to sense the current varying output of said first amplifier and an output to which an output signal is provided, the voltage of which output signal varies as a function of its current varying input; and feedback loop means including a equalization network means for degeneratively feeding back a portion of the frequency dependent output current and a portion of the output signal voltage to the high impedance output of said first amplifier stage to effect gain control over the second stage, the impedance of the output of the first stage high enough so that the fed back voltage in unaffected by the frequency throughout the audio frequency range.

2. The preamplifier circuit claimed in claim 1 wherein said first stage amplifier means comprises:

an FET for receiving the input signal at its gate and a serially connected current-controlling means for controlling the current flow through said FET.

3. The preamplifier circuit claimed in claim 2 wherein said current-controlling means comprises:

a second FET serially connected with said first FET between bilateral power sources of opposite polarity through a current carrying node and a capacitive reactance connected between the node and the gate of said second FET, a fed back current flow from said feedback loop means to the gate of of said second FET to effecting current control thereof.

4. The preamplifier circuit claimed in claim 1 wherein said second amplifier stage comprises:

a single input, single output differential amplifier having its input connected to the output of said first amplifier stage and its output connected to an output stage.

5. The preamplifier circuit claimed in claim 3 wherein said second amplifier stage comprises:

a single input, single output differential amplifier having its input connected to said node and its output connected to an output stage.

6. The preamplifier circuit claimed in claims 4 or 5 wherein said output stage comprises:

first and second MOSFETs of complementary type configured in a symmetrical common drain push-pull circuit with their respective sources connected to bilateral power source means of opposite polarity.

7. The preamplifier circuit claimed in claim 1 wherein said feedback loop means further comprises:

active RC elements for providing a frequency dependent feedback voltage.

8. The preamplifier circuit claimed in claim 7 further comprising:

shunting means for providing a low impedance shunt across said RC elements when the potential difference across the RC elements is greater than a selected threshold value.

9. The preamplifier circuit claimed in claim 8 wherein said shunting means comprises:

Zener diode means connected across said RC element.

* * * * *